United States Patent
Chang et al.

(10) Patent No.: US 12,114,547 B2
(45) Date of Patent: Oct. 8, 2024

(54) DISPLAY PANEL

(71) Applicant: Au Optronics Corporation, Hsinchu (TW)

(72) Inventors: Kuo-Jui Chang, Hsinchu (TW); Wen-Tai Chen, Hsinchu (TW); Chi-Sheng Chiang, Hsinchu (TW); Yu-Chuan Liao, Hsinchu (TW); Chien-Sen Weng, Hsinchu (TW); Ming-Wei Sun, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 389 days.

(21) Appl. No.: 17/519,585

(22) Filed: Nov. 5, 2021

(65) Prior Publication Data
US 2022/0367591 A1    Nov. 17, 2022

(30) Foreign Application Priority Data
May 12, 2021  (TW) .................................. 110117041

(51) Int. Cl.
*H10K 59/131* (2023.01)
*H10K 59/121* (2023.01)

(52) U.S. Cl.
CPC ......... *H10K 59/131* (2023.02); *H10K 59/121* (2023.02)

(58) Field of Classification Search
CPC ................................................. H03K 19/0175
See application file for complete search history.

(56) References Cited

U.S. PATENT DOCUMENTS

| | | | |
|---|---|---|---|
| 9,013,098 B1 * | 4/2015 | Kim | H10K 59/352 |
| | | | 313/504 |
| 9,245,932 B2 * | 1/2016 | Yoon | H10K 59/122 |
| 9,461,098 B2 | 10/2016 | Choi et al. | |
| 9,478,592 B2 | 10/2016 | Park et al. | |
| 9,768,382 B2 | 9/2017 | Wang et al. | |
| 9,825,111 B2 | 11/2017 | Park et al. | |
| 9,858,847 B2 | 1/2018 | Matsueda et al. | |
| 9,960,216 B2 | 5/2018 | Lee et al. | |
| 10,483,336 B2 | 11/2019 | Lee et al. | |

(Continued)

FOREIGN PATENT DOCUMENTS

| | | |
|---|---|---|
| CN | 105789253 | 7/2016 |
| CN | 104465671 | 8/2016 |

(Continued)

*Primary Examiner* — Evren Seven
(74) *Attorney, Agent, or Firm* — JCIPRNET

(57) ABSTRACT

Provided is a display panel, including a substrate, multiple pixel circuits, an insulating layer, multiple first electrodes, a first isolation structure, and a second isolation structure. The pixel circuits are located on the substrate. The insulating layer is located on the pixel circuits and has multiple through holes. The first electrodes are located on the insulating layer and are respectively electrically connected to the pixel circuits through the through holes. The first isolation structure is located on the insulating layer and overlaps the through holes. The second isolation structure includes multiple separating parts and multiple cover parts. The separating parts and the first isolation structure at least partially overlap, and the cover parts respectively overlap the through holes and the first isolation structure.

6 Claims, 15 Drawing Sheets

(56) References Cited

U.S. PATENT DOCUMENTS

| | | | |
|---|---|---|---|
| 10,608,065 B2 | 3/2020 | Heo | |
| 10,825,884 B2* | 11/2020 | Liu | G09G 3/2003 |
| 2001/0026125 A1* | 10/2001 | Yamazaki | H10K 59/131 |
| | | | 313/506 |
| 2004/0027056 A1* | 2/2004 | Chino | H10K 59/122 |
| | | | 313/500 |
| 2005/0057151 A1* | 3/2005 | Kuwabara | H05B 33/22 |
| | | | 313/506 |
| 2007/0132356 A1* | 6/2007 | Hashimoto | H10K 59/122 |
| | | | 313/292 |
| 2009/0160322 A1* | 6/2009 | Yoshida | H10K 59/173 |
| | | | 313/504 |
| 2014/0145157 A1* | 5/2014 | Kim | H10K 59/00 |
| | | | 257/40 |
| 2015/0012985 A1 | 1/2015 | Hirsh | |
| 2016/0079323 A1* | 3/2016 | Choi | H10K 59/122 |
| | | | 257/40 |
| 2016/0155786 A1* | 6/2016 | Park | H10K 59/122 |
| | | | 438/23 |
| 2016/0203748 A1 | 7/2016 | Matsueda et al. | |
| 2016/0351636 A1* | 12/2016 | Lee | H10K 59/122 |
| 2016/0359112 A1 | 12/2016 | Wang et al. | |
| 2017/0012092 A1 | 1/2017 | Park et al. | |
| 2017/0317154 A1 | 11/2017 | Heo | |
| 2018/0212007 A1 | 7/2018 | Lee et al. | |
| 2020/0185480 A1 | 6/2020 | Heo | |
| 2020/0212146 A1* | 7/2020 | Shin | H10K 59/121 |

FOREIGN PATENT DOCUMENTS

| | | |
|---|---|---|
| CN | 106206646 | 12/2016 |
| CN | 106898298 | 6/2017 |
| CN | 105655346 | 9/2017 |
| CN | 105448953 | 6/2018 |
| CN | 110634924 | 12/2019 |
| CN | 112310185 | 2/2021 |
| TW | 201739081 | 11/2017 |

* cited by examiner

DISPLAY PANEL

CROSS-REFERENCE TO RELATED APPLICATION

This application claims the priority benefit of Taiwan application serial no. 110117041, filed on May 12, 2021. The entirety of the above-mentioned patent application is hereby incorporated by reference herein and made a part of this specification.

BACKGROUND

Technical Field

The disclosure relates to a panel, and more particularly to a display panel.

Description of Related Art

A light emitting layer may be formed by using, for example, an ink jet printing (IJP) process in an organic light emitting diode display panel process. The ink jet printing process injects liquid organic light emitting material into an opening defined by an isolation structure to form the light emitting layer. However, a recess on the surface of the isolation structure may cause accumulation of the liquid organic light emitting material, which leads to insufficient film thickness and poor uniformity of the light emitting layer, resulting in a decrease in reliability of the display panel.

SUMMARY

The disclosure provides a display panel with improved reliability.

An embodiment of the disclosure provides a display panel, including a substrate, multiple pixel circuits, an insulating layer, multiple first electrodes, a first isolation structure, and a second isolation structure. The pixel circuits are located on the substrate. The insulating layer is located on the pixel circuits and has multiple through holes. The first electrodes are located on the insulating layer and are respectively electrically connected to the pixel circuits through the through holes. The first isolation structure is located on the insulating layer and overlaps the through holes. The second isolation structure includes multiple separating parts and multiple cover parts. The separating parts and the first isolation structure at least partially overlap, and the cover parts respectively overlap the through holes and the first isolation structure.

In an embodiment of the disclosure, the display panel further includes a light emitting layer and a second electrode. The light emitting layer and the second electrode overlap the first electrode. The first electrode, the light emitting layer, and the second electrode constitute multiple light emitting devices, and the separating parts separate the light emitting devices.

In an embodiment of the disclosure, the first isolation structure is a stripe structure, and the extending direction of the stripe structure intersects the extending direction of the separating parts.

In an embodiment of the disclosure, the separating parts are parallel to each other.

In an embodiment of the disclosure, the separating parts and the cover parts are separated.

In an embodiment of the disclosure, the cover parts are respectively located between two of the separating parts, and the cover parts are respectively connected to one of the two of the separating parts.

In an embodiment of the disclosure, the separating parts are respectively connected to the cover parts.

In an embodiment of the disclosure, a part of the separating parts are not connected to the cover parts, and another part of the separating parts are respectively connected to the cover parts.

In an embodiment of the disclosure, the cover parts respectively overlap the separating parts.

In an embodiment of the disclosure, the first isolation structure is a mesh structure and includes a first subpart and a second subpart. The first subpart overlaps the through holes, and the second subpart overlaps the separating parts.

In an embodiment of the disclosure, the cover parts are located between the separating parts and the second subpart.

In an embodiment of the disclosure, the separating parts are located between the cover parts and the second subpart.

In an embodiment of the disclosure, the material of the separating parts and the material of the cover parts are the same.

In an embodiment of the disclosure, the material of the separating parts and the material of the cover parts are different.

In order to make the aforementioned features and advantages of the disclosure comprehensible, embodiments accompanied with drawings are described in detail below.

DESCRIPTION OF THE EMBODIMENTS

Figure 1A:
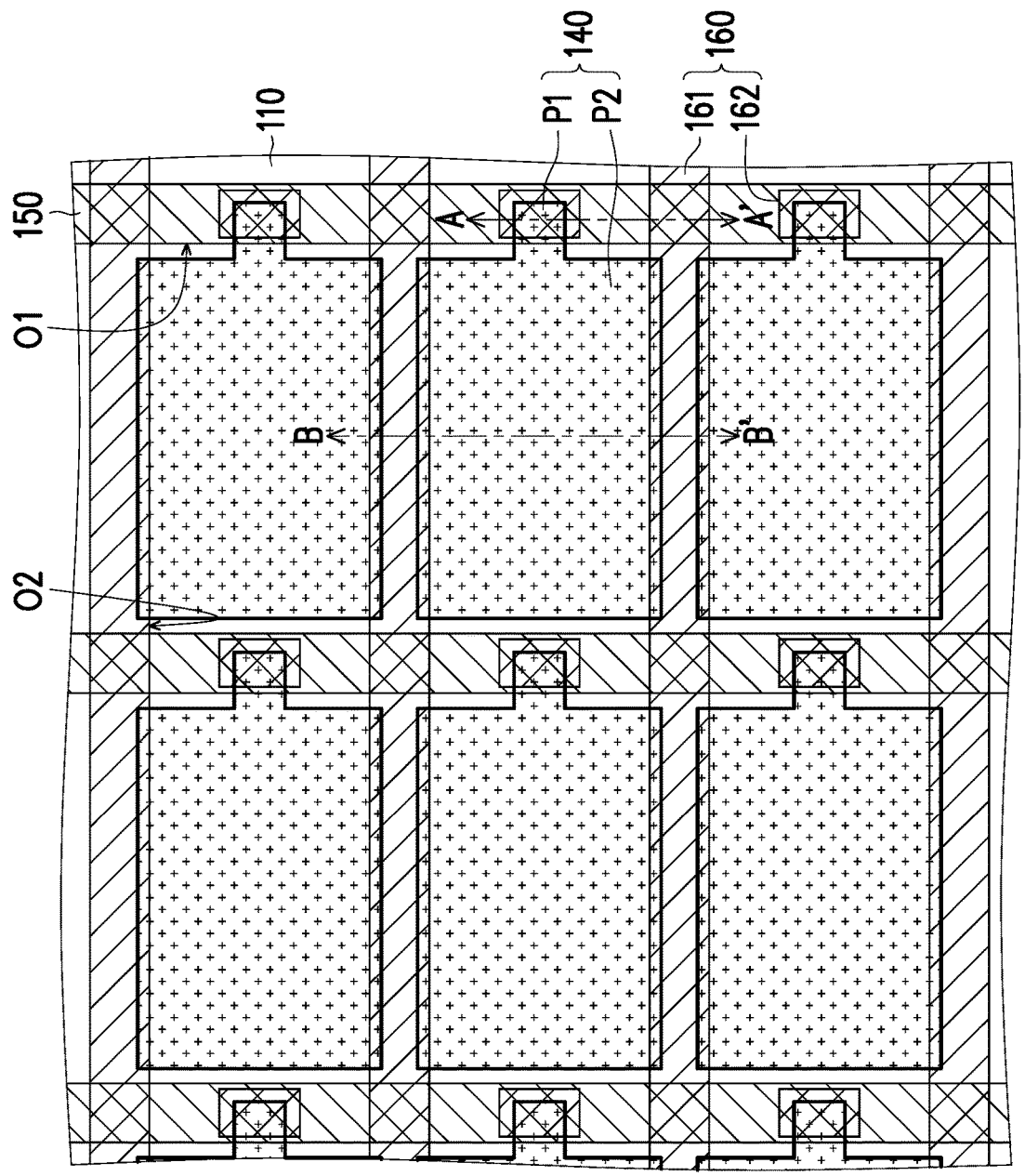
FIG. 1A is a schematic top view of a display panel 10 according to an embodiment of the disclosure.
Figure 1B:
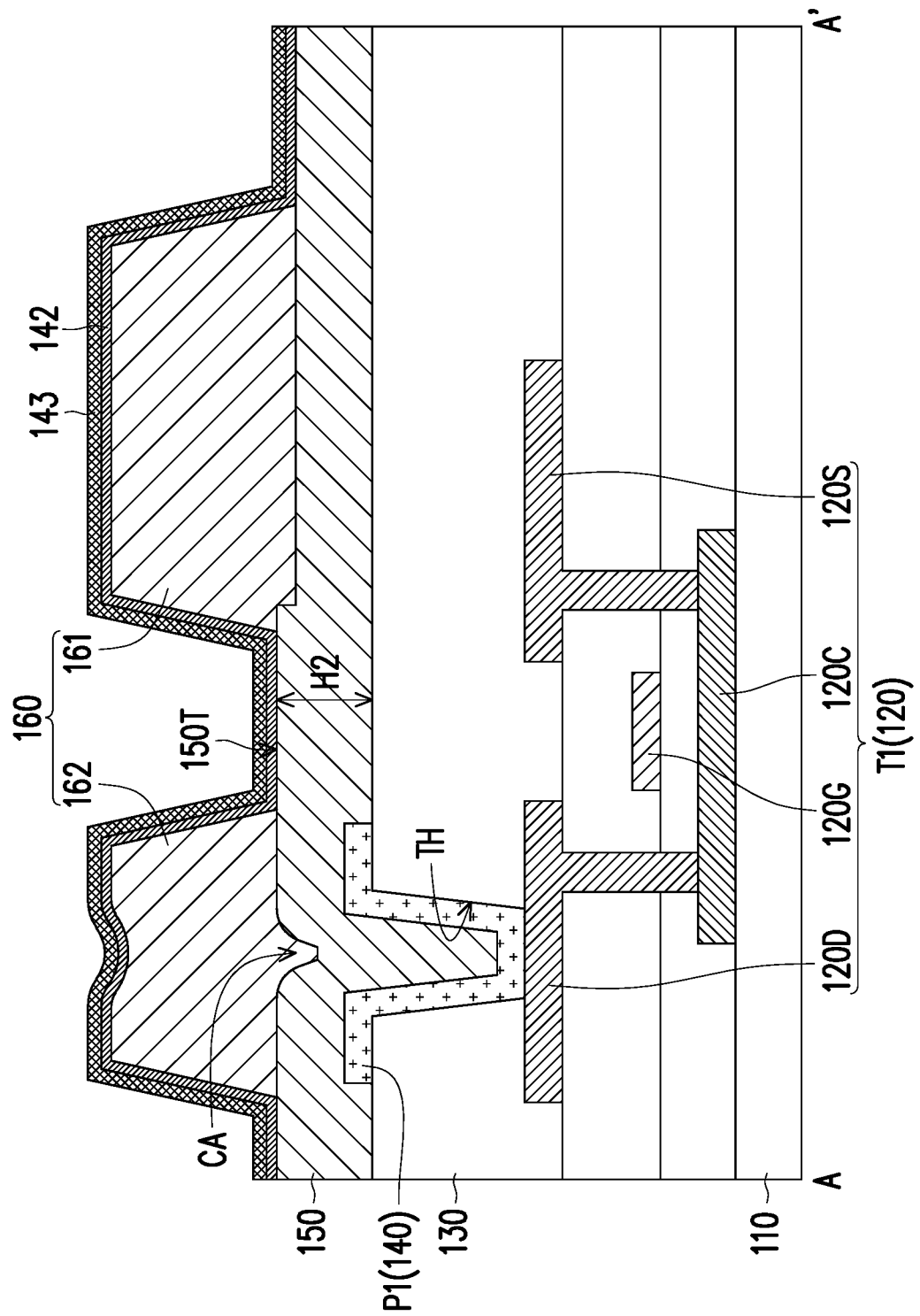
FIG. 1B is a schematic cross-sectional view taken along a section line A-A' of FIG. 1A.
Figure 1C:
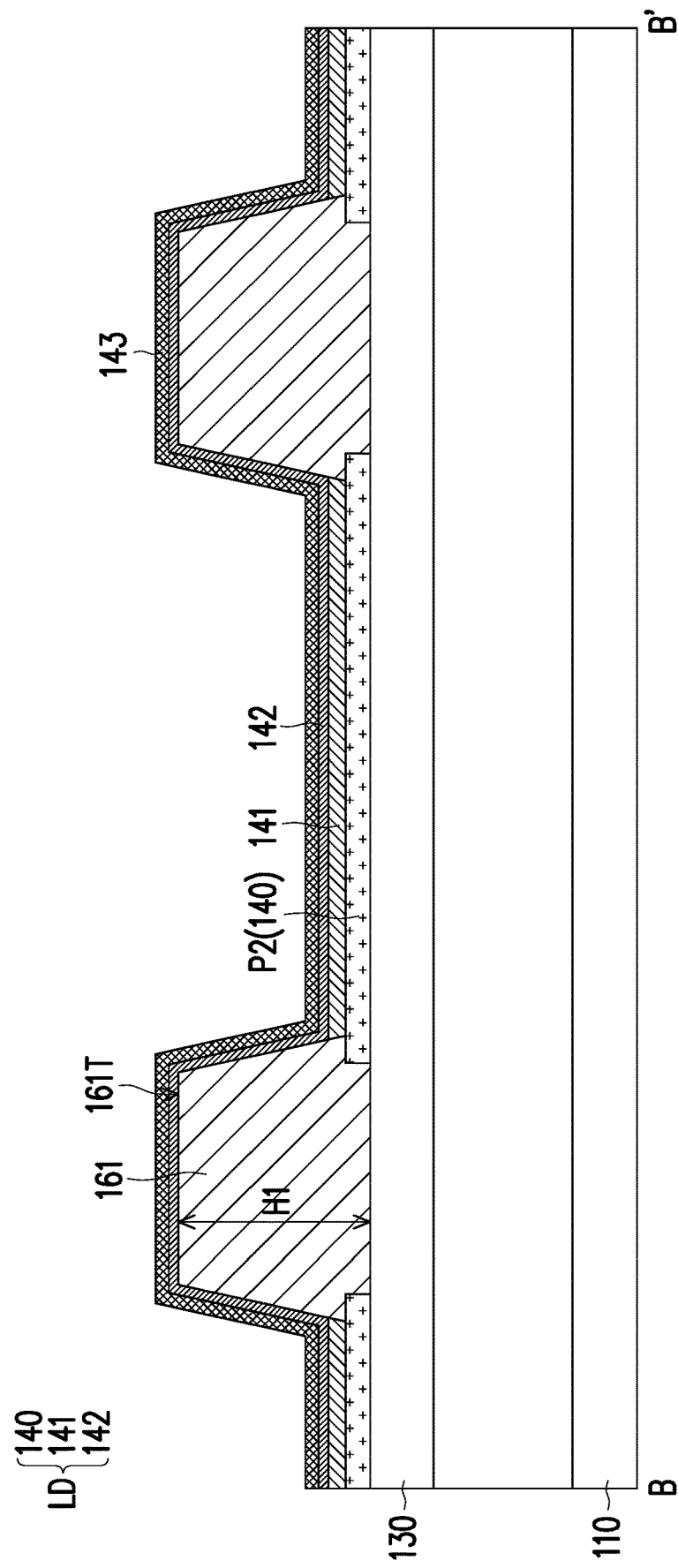
FIG. 1C is a schematic cross-sectional view taken along a section line B-B' of FIG. 1A.

FIG. 1A is a schematic top view of a display panel 10 according to an embodiment of the disclosure. FIG. 1B is a schematic cross-sectional view taken along a section line A-A' of FIG. 1A. FIG. 1C is a schematic cross-sectional view taken along a section line B-B' of FIG. 1A. For simplicity and clarity, FIG. 1A omits other components in FIG. 1B and FIG. 1C except for a substrate 110, a first electrode 140, a first isolation structure 150, and a second isolation structure 160. Hereinafter, please refer to FIG. 1A to FIG. 1C together for clearly understanding the overall structure of the display panel 10.

With reference to FIG. 1A and FIG. 1B together, the display panel 10 includes: the substrate 110, multiple pixel circuits 120, an insulating layer 130, multiple first electrodes 140, the first isolation structure 150, and the second isolation structure 160. The pixel circuits 120 are located on the substrate 110. The insulating layer 130 is located on the pixel circuits 120 and has multiple through holes TH. The first electrodes 140 are located on the insulating layer 130 and are respectively electrically connected to the pixel circuits 120 through the through holes TH. The first isolation structure 150 is located on the insulating layer 130 and overlaps the through holes TH. The second isolation structure 160 includes multiple separating parts 161 and multiple cover parts 162. The separating parts 161 and the first isolation structure 150 at least partially overlap, and the cover parts 162 respectively overlap the through holes TH and the first isolation structure 150.

In view of the above, in the display panel 10 of an embodiment of the disclosure, the cover part 162 of the second isolation structure 160 is disposed to cover a recess CA in the first isolation structure 150, which may not only avoid accumulation of liquid organic light emitting material in the recess CA but also ensure the sufficient film thickness formed by the liquid organic light emitting material, thereby improving reliability of the display panel 10.

Hereinafter, accompanied with FIG. 1A to FIG. 1C, the description of the implementation of each device and film of the display panel 10 is continued, but the disclosure is not limited thereto.

The substrate 110 may be a metal substrate, a glass substrate, or a flexible substrate. When the substrate 110 is a flexible substrate, the material thereof includes flexible materials such as polyimide (PA), polyimide (PI), polymethyl methacrylate (PMMA), polyethylene naphthalate (PEN), polyethylene terephthalate (PET), fiber reinforced plastics (FRP), polyetheretherketone (PEEK), epoxy resin, other suitable materials, or a combination of at least two of the foregoing, but the disclosure is not limited thereto. Various films for forming the pixel circuits 120 and circuit components (such as multiple scanning lines and multiple data lines) for realizing display functions or transmitting electrical signals may be disposed on the substrate 110.

The pixel circuits 120 may be disposed on the substrate 110 by being arranged in an array. In this embodiment, each pixel circuit 120 may include at least one thin-film transistor T1, and the thin-film transistor T1 may include a gate 120G, a semiconductor layer 120C, a source 120S, and a drain 120D. The source 120S and the drain 120D of the thin-film transistor T1 are separated from each other, and the source 120S and the drain 120D respectively contact the semiconductor layer 120C. The gate 120G of the thin-film transistor T1 may be electrically connected to one of multiple scanning lines, and the source 120S of the thin-film transistor T1 may be electrically connected to one of multiple data lines.

The insulating layer 130 is disposed on the pixel circuits 120, and the first electrode 140 is disposed on the insulating layer 130. The first electrode 140 may be electrically connected to the drain 120D of the thin-film transistor T1 of the pixel circuit 120 through the through hole TH in the insulating layer 130. In this way, the thin-film transistor T1 may be turned on or turned off with a signal transmitted by the scanning line, and a signal transmitted on the data line may be transmitted to the first electrode 140 when the thin-film transistor T1 is turned on. In some embodiments, each pixel circuit 120 may further include at least one capacitor structure, and other signaling lines such as power lines or shared signal lines may further be disposed on the substrate 110 to provide a power signal and a shared signal to the pixel circuit 120.

The material of the insulating layer 130 may include transparent insulating materials such as silicon oxide, silicon nitride, silicon oxynitride, organic materials, acrylic materials, siloxane materials, polyimide materials, and epoxy materials, but the disclosure is not limited thereto. The insulating layer 130 may further have a monolayer structure or a multilayer structure. The multilayer structure is, for example, a lamination of any two or more layers among the above insulating materials, which may be combined and changed as needed.

With reference to FIG. 1C, in this embodiment, the display panel 10 further includes a light emitting layer 141 and a second electrode 142. The light emitting layer 141 and the second electrode 142 overlap the first electrode 140, and the first electrode 140, the light emitting layer 141, and the second electrode 142 constitute multiple light emitting devices LD. For example, the first electrode 140 may be an anode of the light emitting device LD, and the second electrode 142 may be a cathode of the light emitting device LD.

With reference to FIG. 1A to FIG. 1C together, the first electrode 140 may include a part P1 and a part P2. The part P1 overlaps the through hole TH, and the first isolation structure 150 is located on the insulating layer 130 and partially covers the part P1 of the first electrode 140. In this embodiment, the first isolation structure 150 is multiple stripe structures extending along one single direction, but the disclosure is not limited thereto. The first isolation structure 150 may have an opening O1 between the stripe structures, and the opening O1 exposes the part P2 of the first electrode 140.

In this embodiment, the separating parts 161 of the second isolation structure 160 may be stripe structures extending along one single direction, which means the separating parts 161 are parallel to each other. In addition, the extending direction of the stripe structures of the separating parts 161 may intersect the extending direction of the stripe structures of the first isolation structure 150. For example, in this embodiment, the extending direction of the separating parts 161 may be substantially perpendicular to the extending direction of the first isolation structure 150. Between the separating parts 161 may exist an opening O2, and the part where the opening O1 and the opening O2 overlap may expose the part P2 of the first electrode 140. In other words, the part P2 of the first electrode 140 at least partially does not overlap the first isolation structure 150 and the second isolation structure 160. In this embodiment, the part P2 of the first electrode 140 may have an outline similar to a rectangle, and the part P1 may be connected to a side of the rectangle of the part P2, but the disclosure is not limited thereto. In addition, the cover parts 162 of the second isolation structure 160 may be stacked on the first isolation structure 150.

The material of the first isolation structure 150 may include inorganic materials or organic materials. The material of the separating part 161 of the second isolation structure 160 may include organic materials, and the surface of the separating part 161 is hydrophobic. The material of the cover part 162 of the second isolation structure 160 may include organic materials or inorganic materials. The foregoing inorganic materials include silicon oxide (SiOx), silicon nitride (SiNx), other oxides, other nitrides, or other suitable materials, but the disclosure is not limited thereto. The foregoing organic materials include photoresist materials, curable resin materials, or other suitable materials, but the disclosure is not limited thereto.

The light emitting layer 141 is located in the opening O1 and the opening O2 and covers the part P2 of the first electrode 140. In this way, the separating parts 161 of the first isolation structure 150 and the second isolation structure 160 may isolate the light emitting devices LD from each other to form the light emitting devices LD arranged in an array. In some embodiments, the light emitting layer 141 may have a multilayer structure. For example, the light emitting layer 141 may include a hole injection layer, a hole transport layer, a light emitting layer, an electron transport layer, an electron injection layer, and the like, which are sequentially disposed in the area where the opening O1 and the opening O2 overlap. In some embodiments, the display panel 10 may further include a cover layer 143, the second electrode 142, and the cover layer 143 that may be sequentially disposed on the light emitting layer 141 and cover the top surface and side surfaces of the first isolation structure 150 and the second isolation structure 160.

In this embodiment, the cover part 162 is separated from separating part 161, but the disclosure is not limited thereto. In this embodiment, the cover part 162 is a bump structure, and the cover part 162 overlaps the part P1 of the first electrode 140 and the first isolation structure 150. The cover part 162 may partially overlap the part P1 of the first electrode 140, but the disclosure is not limited thereto. In some embodiments, an orthographic projection of the cover part 162 on the substrate 110 may completely fall into an orthographic projection of the part P1 of the first electrode 140 on the substrate 110. In other words, the cover part 162 completely overlaps the part P1 of the first electrode 140.

In FIG. 1C, a perpendicular distance H1 from a top surface 161T of the separating part 161 to the insulating layer 130 is greater than a perpendicular distance H2 from a top surface 150T of the first isolation structure 150 to the insulating layer 130 in FIG. 1B. In other words, the top surface 161T of the separating part 161 not overlapping the first isolation structure 150 is farther away from the substrate 110 than the top surface 150T of the first isolation structure 150. With this design of heights, the separating part 161 may isolate different light emitting devices LD arranged in the same row along a first direction D1 from each other to avoid organic light emitting materials of the different light emitting devices LD from mixing with each other, thereby reducing color mixing defects of the display panel 10 and enhancing light emitting display effect of the display panel 10.

For example, after the first electrode 140, the first isolation structure 150, and the second isolation structure 160 are formed on the substrate 110, the light emitting layer 141 of the light emitting device LD may be formed by an ink jet printing process in the area where the opening O1 and the opening O2 overlap. The light emitting layer 141 may include multiple sublayers. The ink jet printing process may first spray liquid organic light emitting material and then cure the organic light emitting material through a drying process to form the sublayers in the light emitting layer 141. The required light emitting layer 141 may be formed by repeating the ink jet printing process and the curing procedure. The light emitting layers 141 arranged in the same row along the first direction D1 may be formed by spraying different organic light emitting materials, and the light emitting layers 141 arranged in the same row along a second direction D2 may be formed by spraying the same organic light emitting material. Since the top surface 161T of the separating part 161 is farther away from the substrate 110 than the top surface 150T of the first isolation structure 150, the different organic light emitting materials in the adjacent light emitting layers 141 in the first direction D1 may be isolated from each other by the separating parts 161 to avoid the different organic light emitting materials in the light emitting layers 141 of the different light emitting devices LD from mixing with each other, thereby reducing color mixing defects of the light emitting devices LD formed subsequently. In addition, since the separating part 161 is separated from the cover part 162, and the top surface 150T of the first isolation structure 150 is closer to the substrate 110 than the top surface 161T of the separating part 161, the same organic light emitting material sprayed along the second direction D2 may flow between the light emitting layers 141 of the light emitting devices LD in the same row to enhance thickness uniformity of the light emitting layers 141.

Hereinafter, the description of other embodiments of the disclosure is continued with the reference numerals and relevant content used in the embodiment of FIG. 1A to FIG. 1C.

Figure 2A:
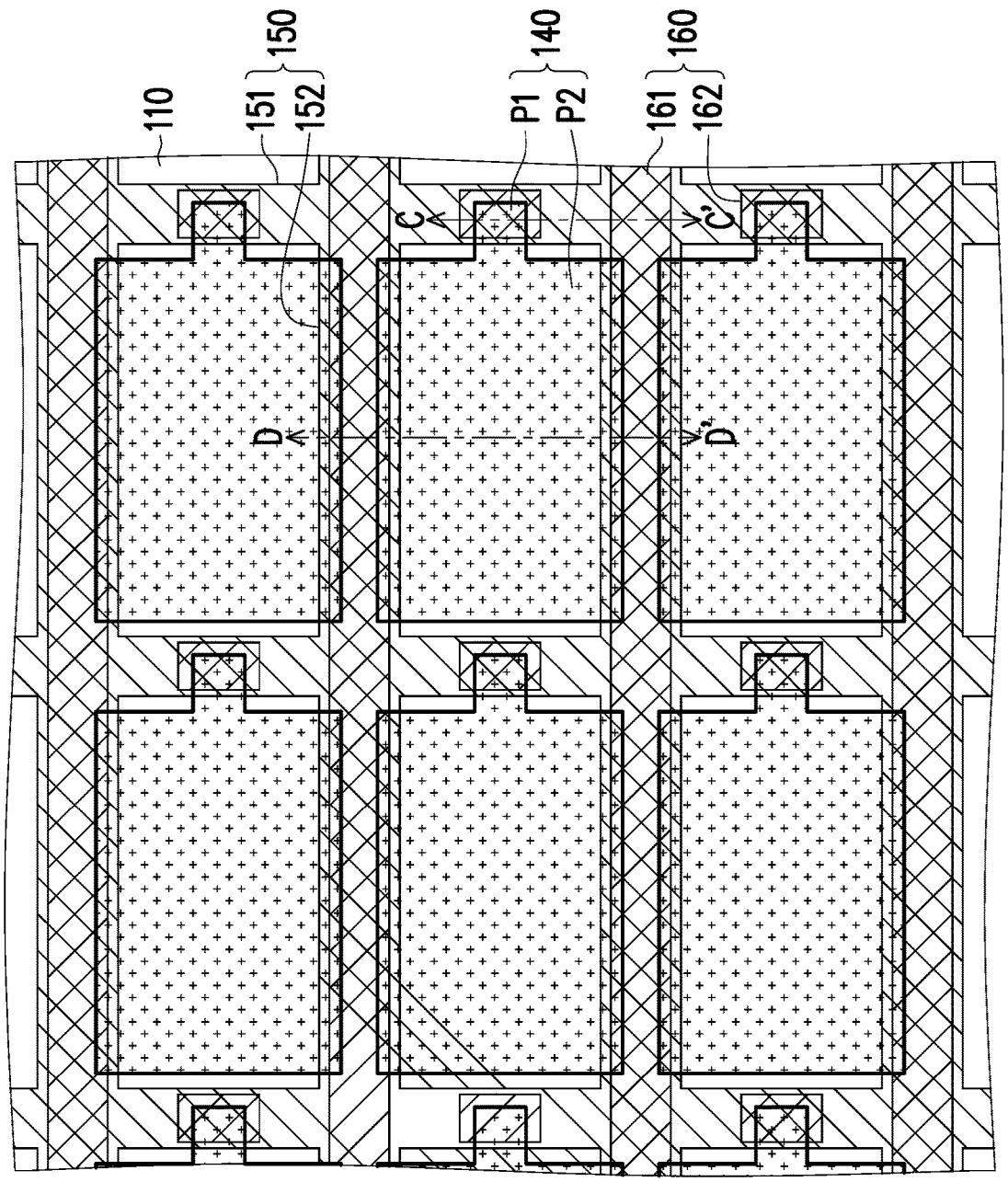
FIG. 2A is a schematic top view of a display panel 20 according to an embodiment of the disclosure.
Figure 2B:
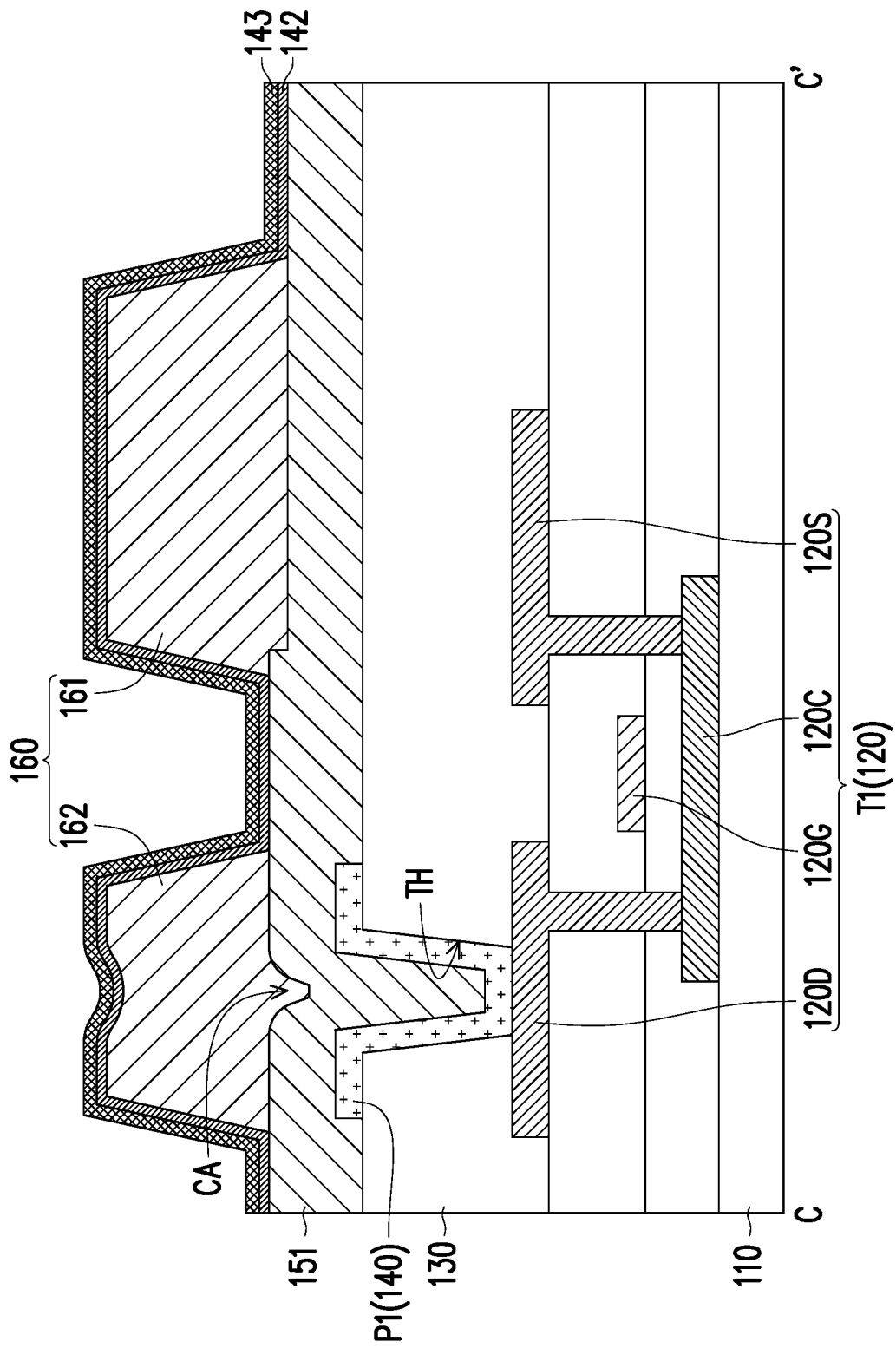
FIG. 2B is a schematic cross-sectional view taken along a section line C-C' of FIG. 2A.
Figure 2C:
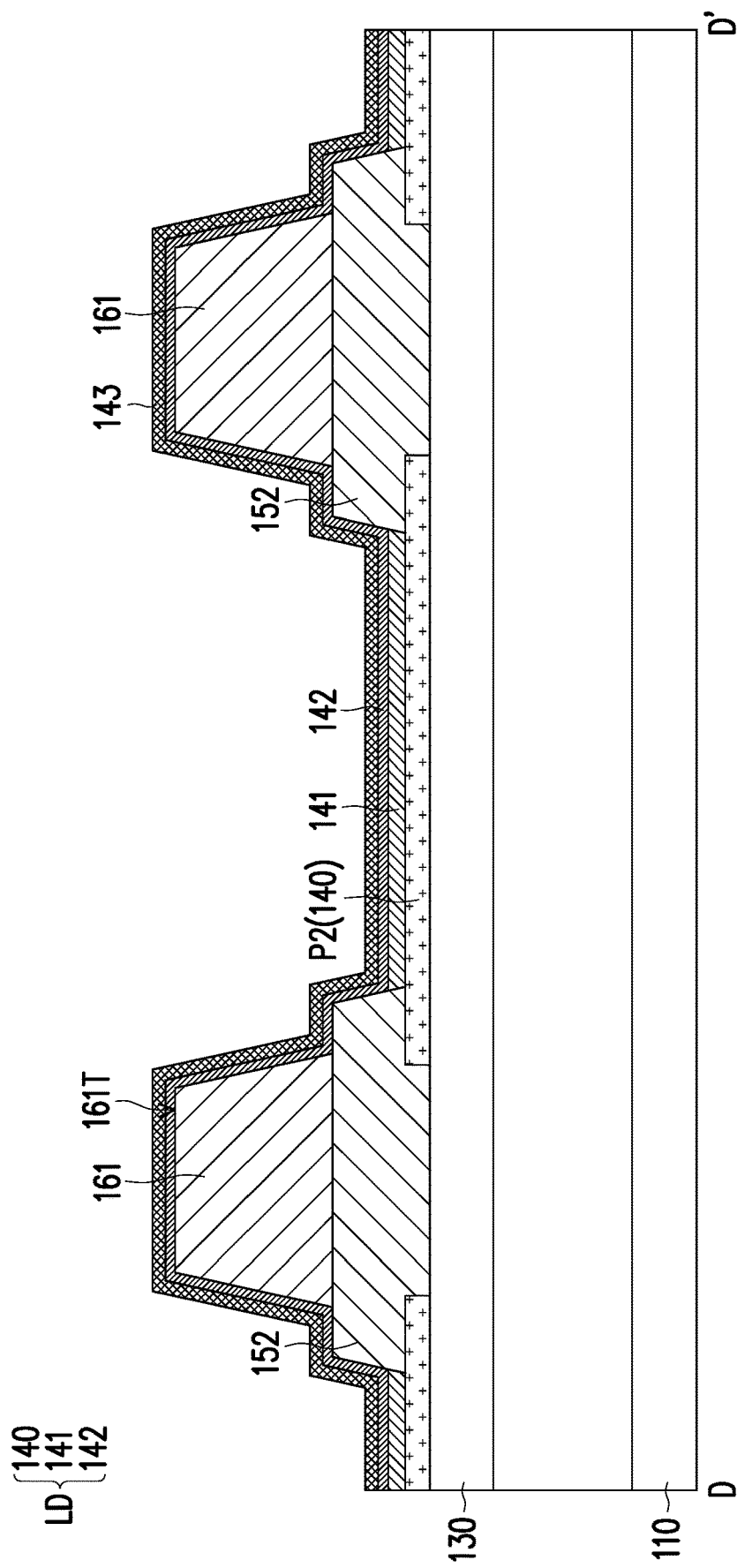
FIG. 2C is a schematic cross-sectional view taken along a section line D-D' of FIG. 2A.

FIG. 2A is a schematic top view of a display panel 20 according to an embodiment of the disclosure. FIG. 2B is a schematic cross-sectional view taken along a section line C-C' of FIG. 2A. FIG. 2C is a schematic cross-sectional view taken along a section line D-D' of FIG. 2A. For simplicity and clarity, FIG. 2A omits other components in FIG. 2B and FIG. 2C except for the substrate 110, the first electrode 140, the first isolation structure 150, and the second isolation structure 160.

With reference to FIG. 2A to FIG. 2C, the display panel 20 includes: the substrate 110, the pixel circuits 120, the insulating layer 130, the first electrodes 140, the first isolation structure 150, and the second isolation structure 160. The pixel circuits 120 are located on the substrate 110, and the insulating layer 130 is located on the pixel circuits 120. The first electrodes 140 are located on the insulating layer 130 and are respectively electrically connected to the pixel circuits 120 through the through holes TH in the insulating layer 130. The first isolation structure 150 is located on the insulating layer 130 and overlaps the through holes TH. The second isolation structure 160 includes the separating parts 161 and the cover parts 162. The cover parts 162 respectively overlap the through holes TH and the first isolation structure 150. The first electrode 140 may include the part P1 and the part P2. The part P1 overlaps the through hole TH, and the part P2 at least partially does not overlap the first isolation structure 150 and the second isolation structure 160.

Compared with the display panel 10 in FIG. 1A to FIG. 1C, the structure in the display panel 20 shown in FIG. 2A to FIG. 2C is different in that: the first isolation structure 150 is a mesh structure, and the first isolation structure 150 includes a first subpart 151 and a second subpart 152. The first subpart 151 overlaps the through hole TH, and the second subpart 152 overlaps the separating part 161.

The extending direction of the first subpart 151 may intersect the extending direction of the second subpart 152, and the intersection of the first subpart 151 and the second subpart 152 may belong to the first subpart 151 and may also belong to the second subpart 152. For example, in this embodiment, the extending direction of the first subpart 151 may be substantially perpendicular to the extending direction of the second subpart 152.

In this embodiment, the separating part 161 may completely overlap the second subpart 152 of the first isolation structure 150, which means an orthographic projection of the separating part 161 on the substrate 110 may completely fall into an orthographic projection of the second subpart 152 on the substrate 110, but the disclosure is not limited thereto. In some embodiments, the separating part 161 may partially overlap the second subpart 152 of the first isolation structure 150. In some embodiments, the orthographic projection of the second subpart 152 on the substrate 110 may completely fall into the orthographic projection of the separating part 161 on the substrate 110.

In this embodiment, the second subpart 152 of the first isolation structure 150 may increase a perpendicular distance from the top surface 161T of the separating part 161 to the insulating layer 130 for further ensuring that the different organic light emitting materials in the light emitting devices LD arranged in the same row along the first direction D1 may be isolated by the separating parts 161 and the second subpart 152 to avoid the different organic light emitting materials in the light emitting layers 141 of the different light emitting devices LD from mixing with each other, thereby reducing color mixing defects of the light emitting devices LD formed subsequently. In addition, with the cover part 162 of the second isolation structure 160 disposed to cover the recess CA in the first subpart 151 of the first isolation structure 150, accumulation of the liquid organic light emitting material in the recess CA may be avoided to ensure the sufficient film thickness formed by the liquid organic light emitting material, thereby improving reliability of the display panel 20.

Figure 3A:
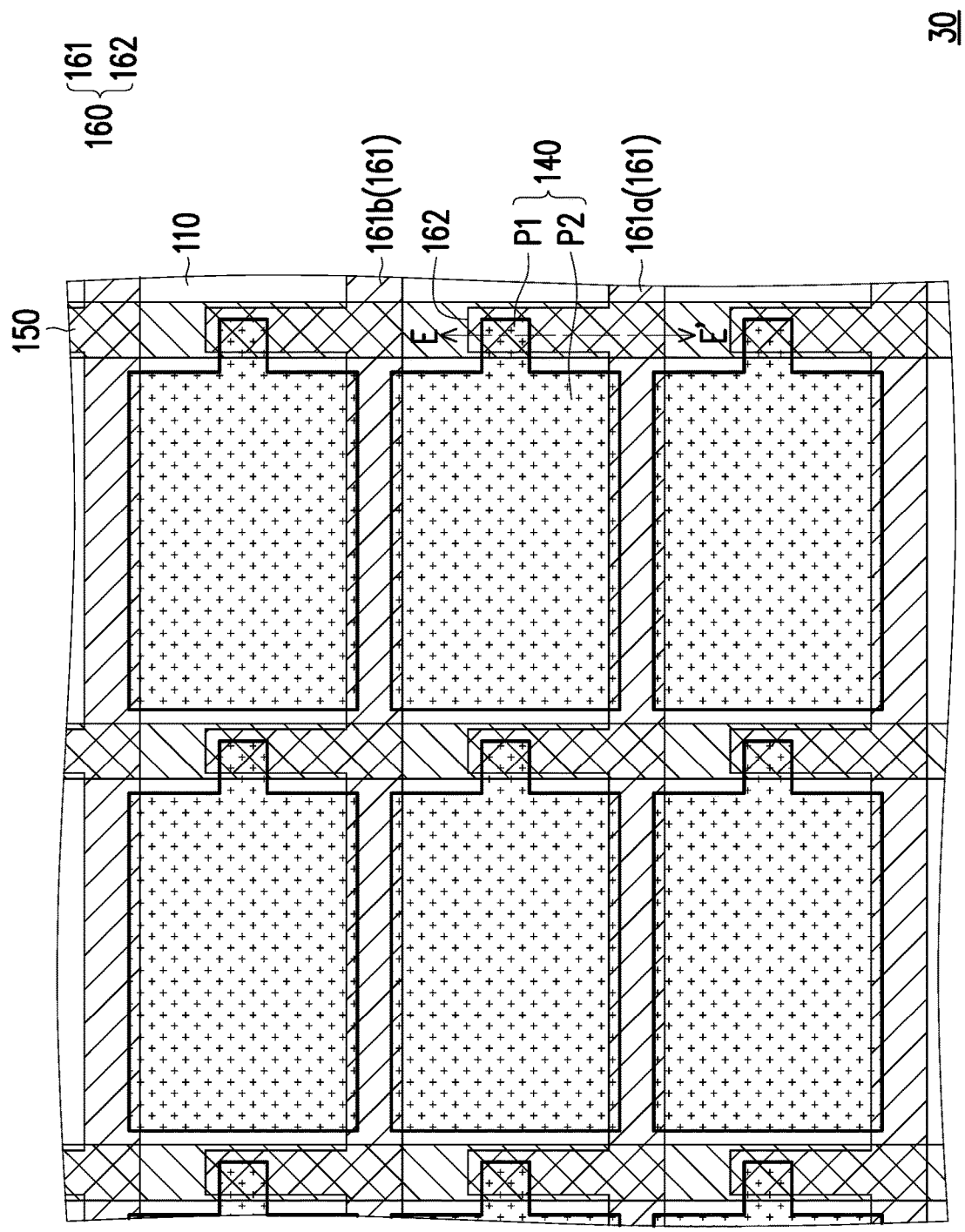
FIG. 3A is a schematic top view of a display panel 30 according to an embodiment of the disclosure.
Figure 3B:
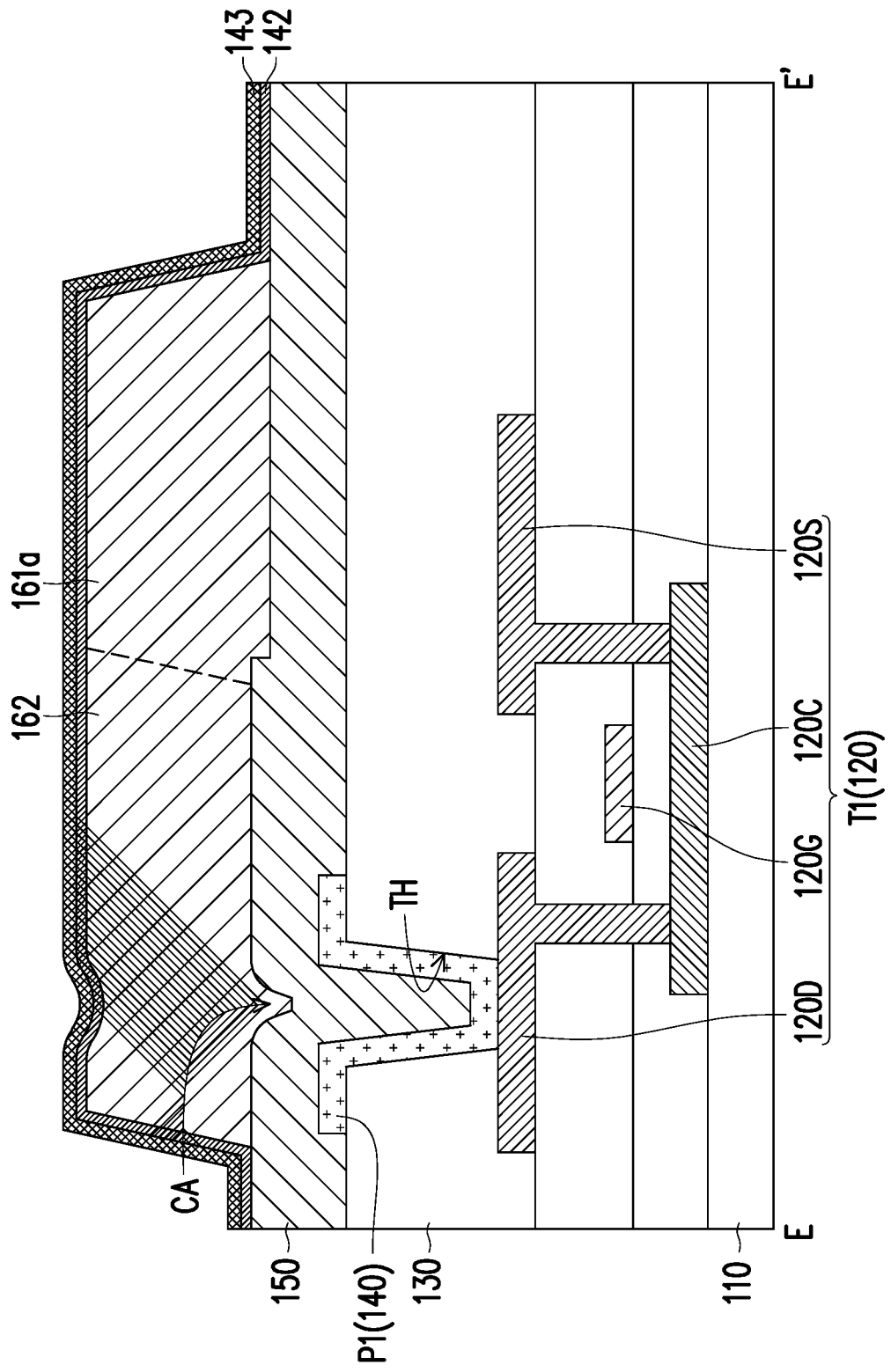
FIG. 3B is a schematic cross-sectional view taken along a section line E-E' of FIG. 3A.

FIG. 3A is a schematic top view of a display panel 30 according to an embodiment of the disclosure. FIG. 3B is a schematic cross-sectional view taken along a section line E-E' of FIG. 3A. For simplicity and clarity, FIG. 3A omits other components in FIG. 3B except for the substrate 110, the first electrode 140, the first isolation structure 150, and the second isolation structure 160.

With reference to FIG. 3A to FIG. 3B together, the display panel 30 includes: the substrate 110, the pixel circuits 120, the insulating layer 130, the first electrodes 140, the first isolation structure 150, and the second isolation structure 160. The pixel circuits 120 are located on the substrate 110, and the insulating layer 130 is located on the pixel circuits 120. The first electrodes 140 are located on the insulating layer 130 and are respectively electrically connected to the pixel circuits 120 through the through holes TH in the insulating layer 130. The first isolation structure 150 is located on the insulating layer 130 and overlaps the through holes TH. The second isolation structure 160 includes the separating parts 161 and the cover parts 162. The separating parts 161 and the first isolation structure 150 partially overlap, and the cover parts 162 respectively overlap the through holes TH and the first isolation structure 150. The first electrode 140 may include the part P1 and the part P2. The part P1 overlaps the through hole TH, and the part P2 at least partially does not overlap the first isolation structure 150 and the second isolation structure 160.

Compared with the display panel 10 in FIG. 1A to FIG. 1C, the structure of the display panel 30 shown in FIG. 3A to FIG. 3B is different in that: the cover part 162 is located between two separating parts 161a, 161b, and the cover part 162 may be connected to one of the separating parts 161a and 161b.

For example, in this embodiment, the cover parts 162 of the same row in the extending direction of the separating parts 161 may be connected to the same separating part 161a. In other words, the cover parts 162 of the same row and the separating part 161a connected thereto may be located on the same side, and each separating part 161 may be connected to multiple cover parts 162, but the disclosure is not limited thereto. In some embodiments, the cover parts 162 in the same row in the extending direction of the separating parts 161 may be alternately connected to the separating parts 161a and 161b. In some embodiments, the separating part 161a may be connected to only one cover part 162, and the separating part 161b may be connected to multiple cover parts 162 according to actual layout requirements.

In addition, in this embodiment, the first isolation structure 150 may be multiple stripe structures extending along one single direction. However, in other embodiments, the first isolation structure 150 may be the mesh structure shown in FIG. 2A. With the cover part 162 of the second isolation structure 160 disposed to cover the recess CA in the first isolation structure 150, accumulation of the liquid organic light emitting material in the recess CA may be avoided to ensure the sufficient film thickness formed by the liquid organic light emitting material, thereby improving reliability of the display panel 30.

Figure 4A:
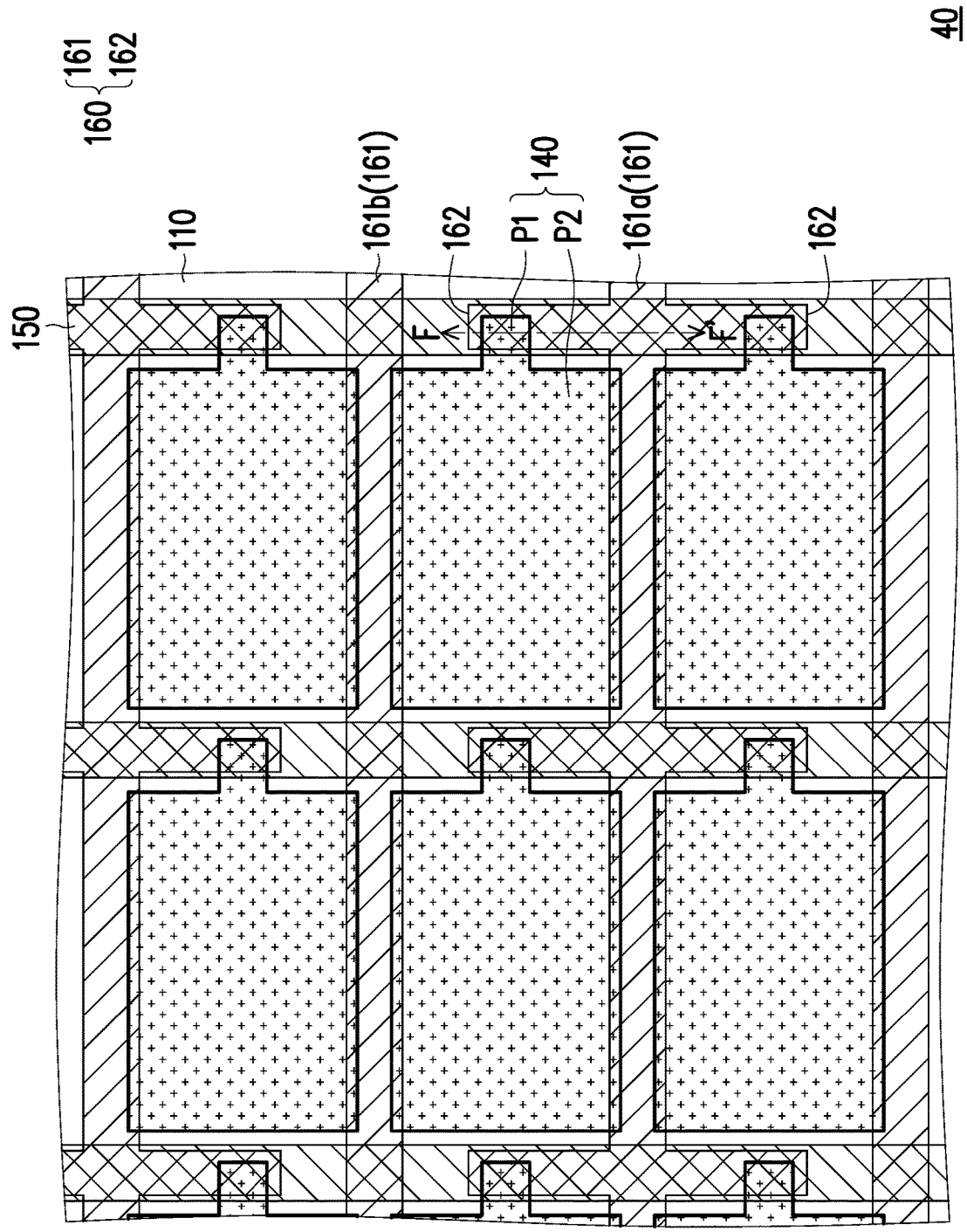
FIG. 4A is a schematic top view of a display panel 40 according to an embodiment of the disclosure.
Figure 4B:
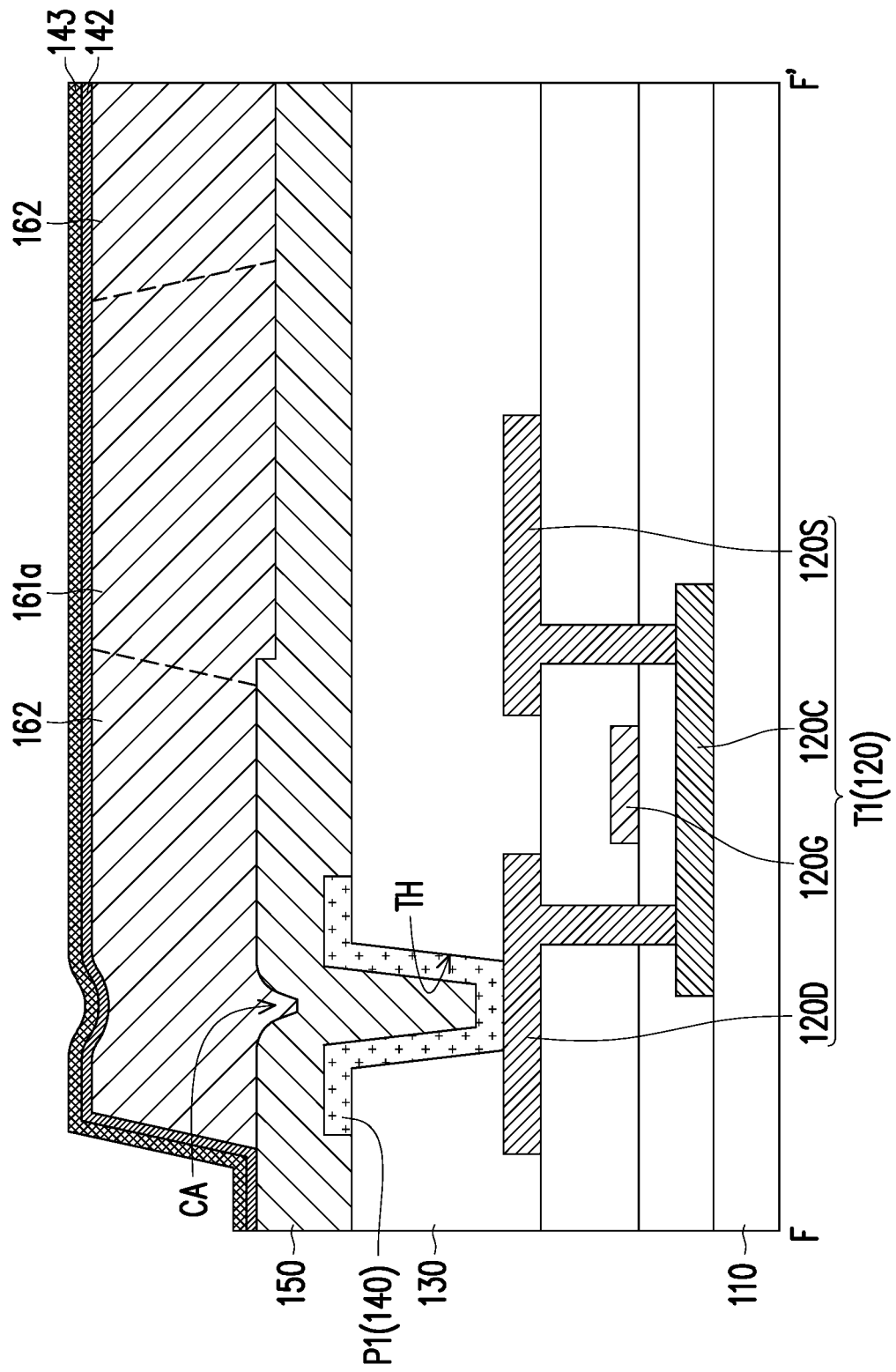
FIG. 4B is a schematic cross-sectional view taken along a section line F-F' of FIG. 4A.

FIG. 4A is a schematic top view of a display panel 40 according to an embodiment of the disclosure. FIG. 4B is a schematic cross-sectional view taken along a section line F-F' of FIG. 4A. Compared with the display panel 30 of FIG. 3A to FIG. 3B, the structure of the display panel 40 shown in FIG. 4A to FIG. 4B is different in that: a part of the separating parts 161 are not connected to the cover part 162, and another part of the separating parts 161 are respectively connected to multiple cover parts 162.

For example, in this embodiment, the separating part 161a may be connected to multiple cover parts 162. The separating part 161b is not connected to the cover part 162, and the separating part 161a and the separating part 161b may be arranged alternately. In addition, in this embodiment, the first isolation structure 150 may be multiple stripe structures extending along one single direction. However, in other embodiments, the first isolation structure 150 may be the mesh structure shown in FIG. 2A. With the cover part 162 of the second isolation structure 160 disposed to cover the recess CA in the first isolation structure 150, accumulation of the liquid organic light emitting material in the recess CA may be avoided to ensure the sufficient film thickness formed by the liquid organic light emitting material, thereby improving reliability of the display panel 40.

Figure 5A:
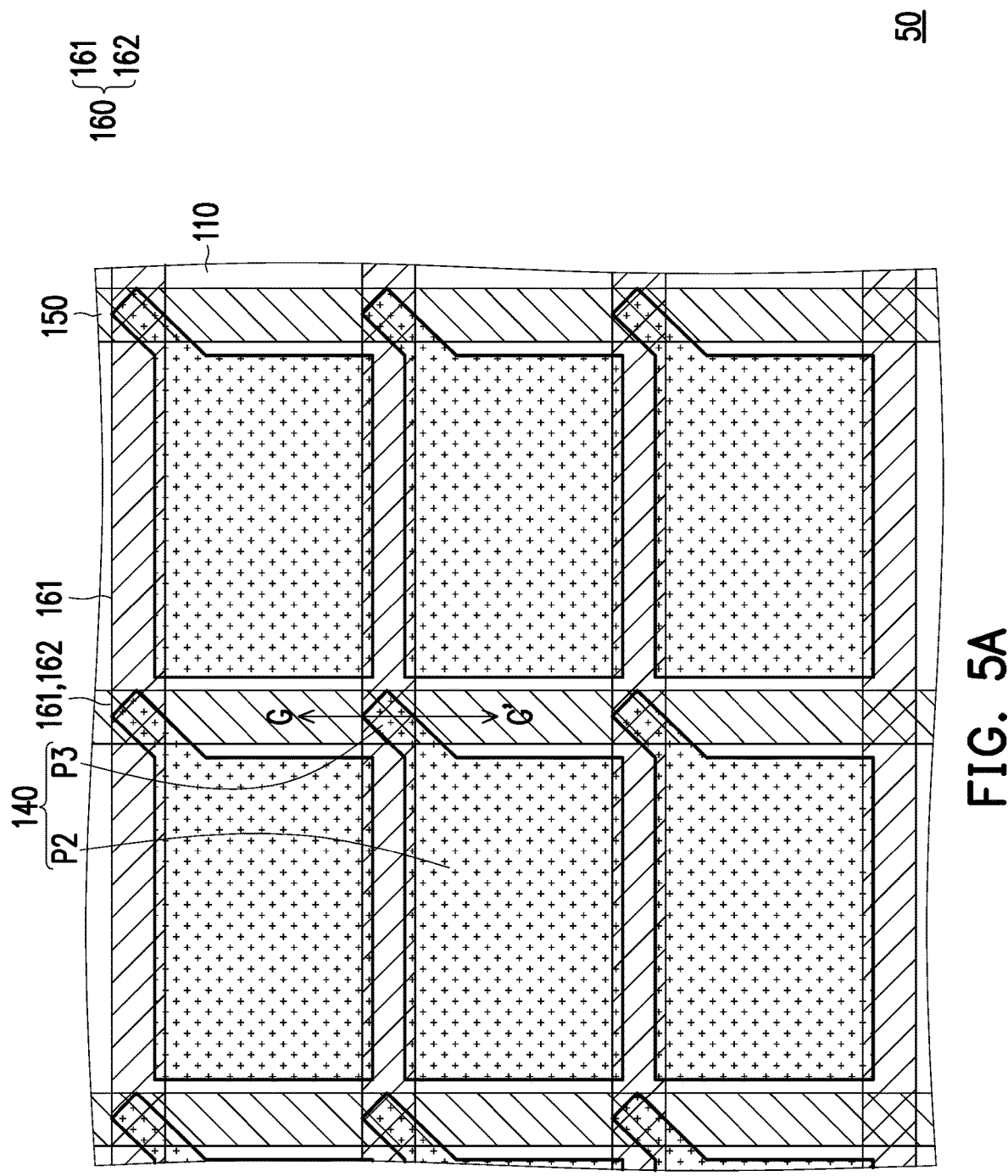
FIG. 5A is a schematic top view of a display panel 50 according to an embodiment of the disclosure.
Figure 5B:
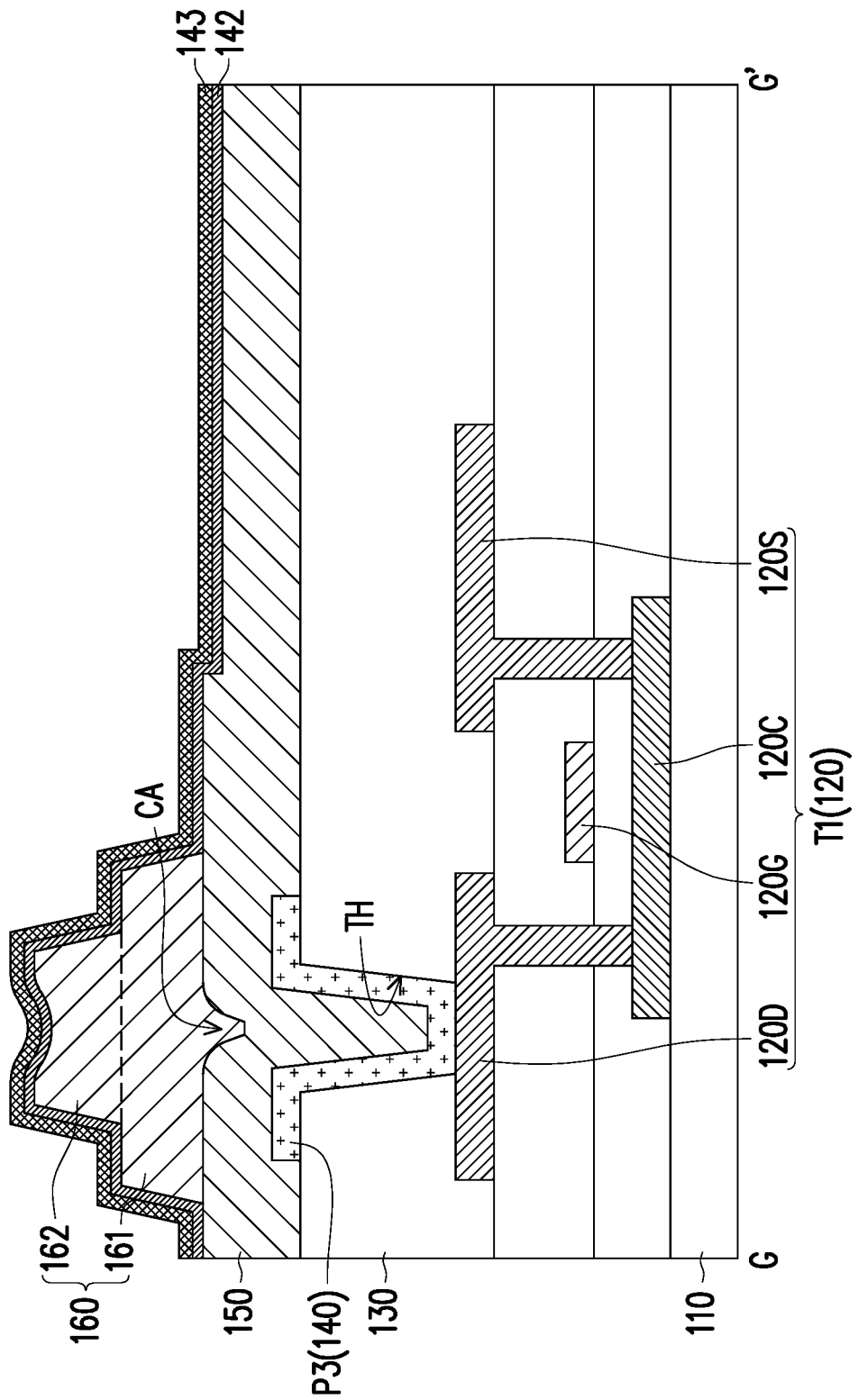
FIG. 5B is a schematic cross-sectional view taken along a section line G-G' of FIG. 5A.

FIG. 5A is a schematic top view of a display panel 50 according to an embodiment of the disclosure. FIG. 5B is a schematic cross-sectional view taken along a section line G-G' of FIG. 5A. In order to make the expression of the diagram more concise, FIG. 5A omits other components except for the substrate 110, the first electrode 140, the first isolation structure 150, and the second isolation structure 160 in FIG. 5B.

With reference to FIG. 5A to FIG. 5B together, the display panel 50 includes: the substrate 110, the pixel circuits 120, the insulating layer 130, the first electrodes 140, the first isolation structure 150, and the second isolation structure 160. The pixel circuits 120 are located on the substrate 110, and the insulating layer 130 is located on the pixel circuits 120. The first electrodes 140 are located on the insulating layer 130 and are respectively electrically connected to the pixel circuits 120 through the through holes TH in the insulating layer 130. The first isolation structure 150 is located on the insulating layer 130 and overlaps the through holes TH. The second isolation structure 160 includes the separating parts 161 and the cover parts 162. The separating parts 161 and the first isolation structure 150 partially overlap, and the cover parts 162 respectively overlap the through holes TH and the first isolation structure 150. The first electrode 140 may include the part P2 and a part P3. The part P3 overlaps the through hole TH, and the part P2 at least partially does not overlap the first isolation structure 150 and the second isolation structure 160.

Compared with the display panel 10 of FIG. 1A to FIG. 1C, the structure of the display panel 50 shown in FIG. 5A to FIG. 5B is different in that: the part P3 of the first electrode 140 is connected to a corner of the rectangle of the part P2, the through hole TH overlaps an area where the separating part 161 and the first isolation structure 150 overlap, and the cover part 162 overlaps the separating part 161.

For example, in this embodiment, the separating part 161 is located between the cover part 162 and the first isolation structure 150, and the material of the separating part 161 and the material of the cover part 162 are the same. The material of the separating part 161 and the cover part 162 may include transparent insulating materials, such as organic materials, acrylic materials, siloxane materials, polyimide materials, and epoxy materials, but the disclosure is not limited thereto. The separating part 161 and the cover part 162 of the second isolation structure 160 may be formed by an exposure and development process and a subsequent curing procedure through a phase shift mask, a half tone mask, or a gray tone mask. In other words, after one exposure procedure, the insulating material may be formed to have different exposure levels including a high-exposure part, a half-exposure part, and a non-exposure part. After a development procedure, the insulating material may be patterned into the second isolation structure 160 with different heights. After development, the curing procedure may be performed to make the structure of the second isolation structure 160 compact and actually cured. In some embodiments, the height of the cover part 162 may be greater than or equal to 0.5 μm, but the disclosure is not limited thereto.

With the cover part 162 of the second isolation structure 160 disposed to cover the recess CA in the first isolation structure 150, accumulation of the liquid organic light emitting material in the recess CA may be avoided to ensure the sufficient film thickness formed by the liquid organic light emitting material, thereby improving reliability of the display panel 50.

Figure 6A:
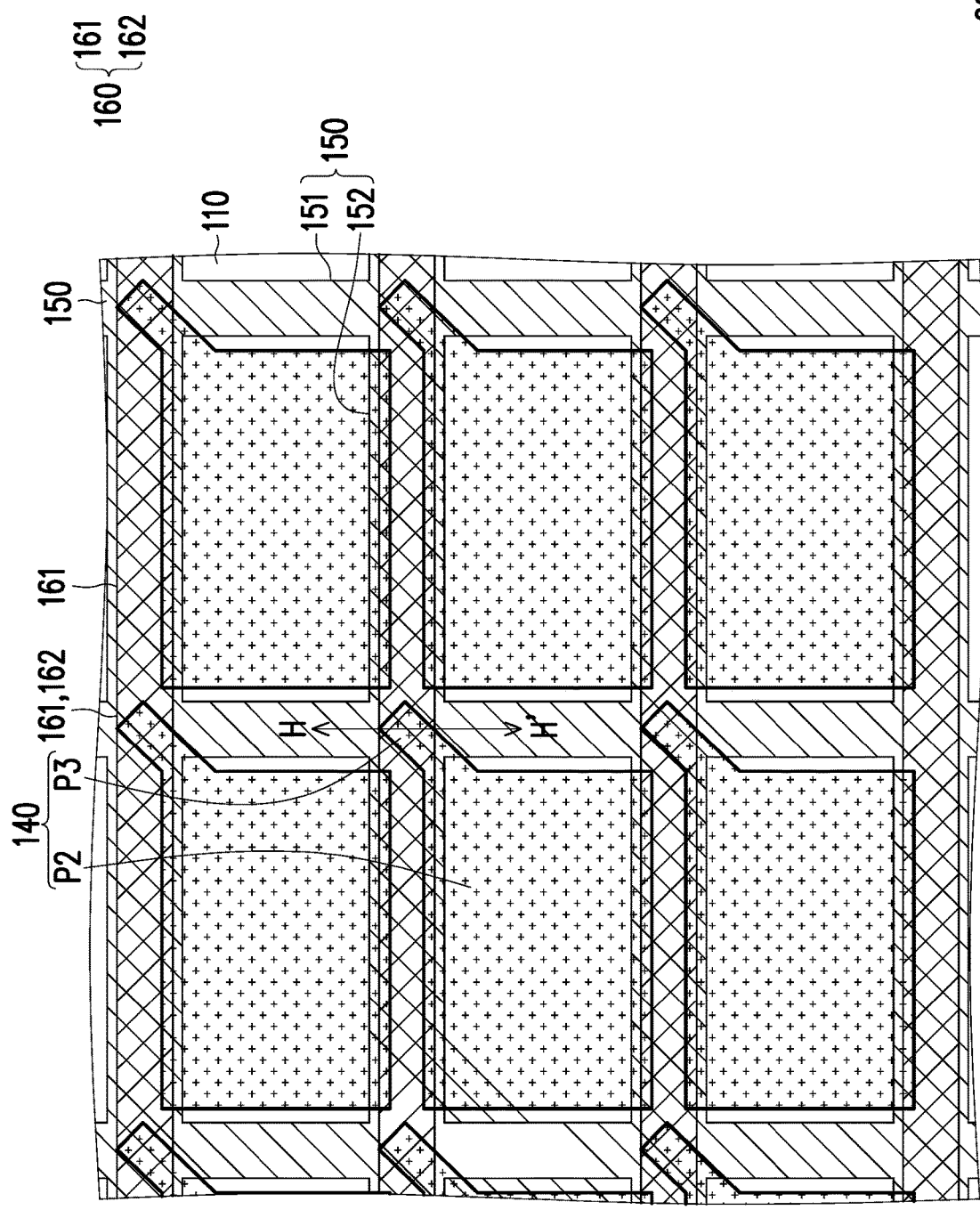
FIG. 6A is a schematic top view of a display panel 60 according to an embodiment of the disclosure.
Figure 6B:
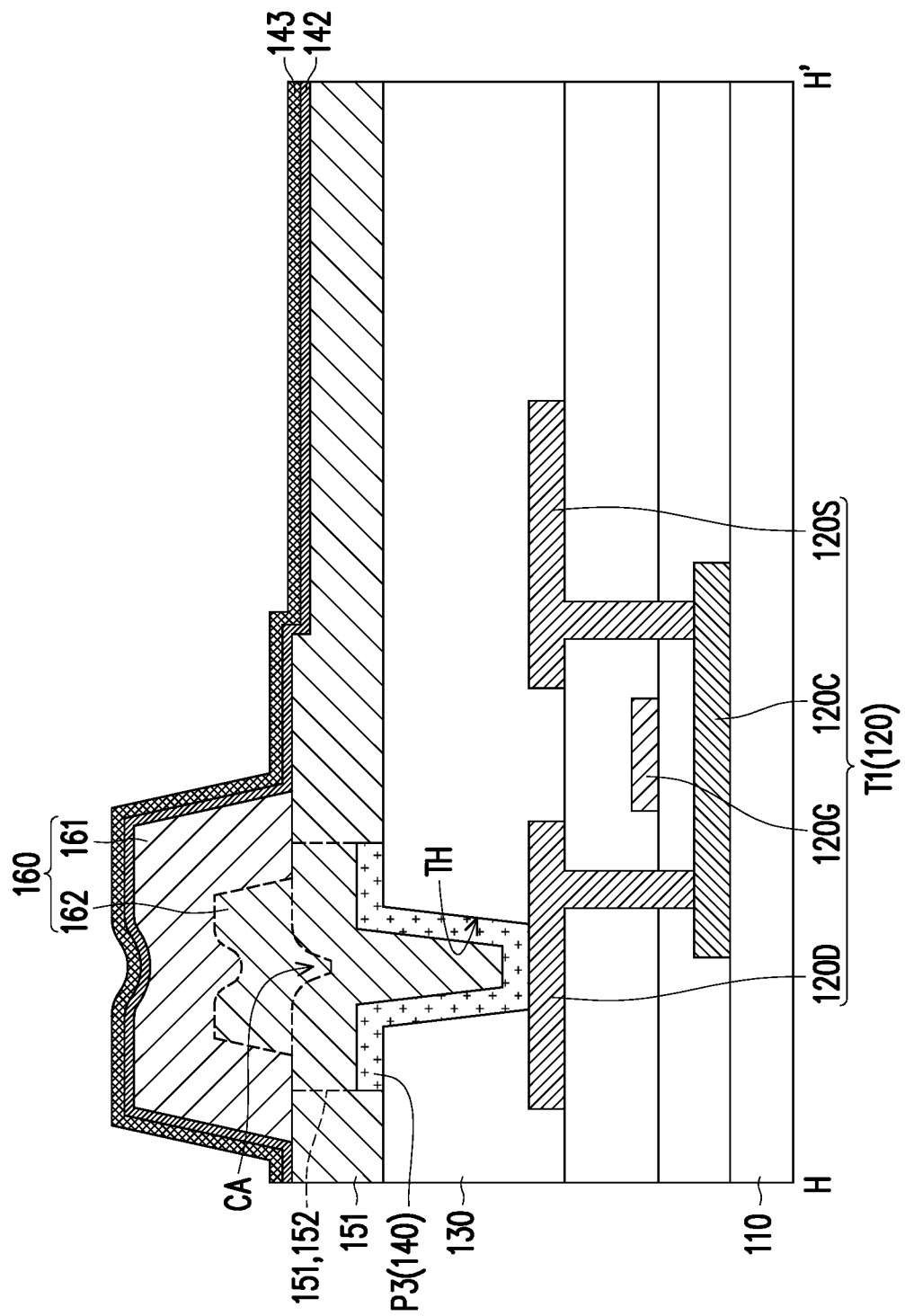
FIG. 6B is a schematic cross-sectional view taken along a section line H-H' of FIG. 6A.

FIG. 6A is a schematic top view of a display panel 60 according to an embodiment of the disclosure. FIG. 6B is a schematic cross-sectional view taken along a section line H-H' of FIG. 6A. For simplicity and clarity, FIG. 6A omits other components in FIG. 6B except for the substrate 110, the first electrode 140, the first isolation structure 150, and the second isolation structure 160.

With reference to FIG. 6A to FIG. 6B, the display panel 60 includes: the substrate 110, the pixel circuits 120, the insulating layer 130, the first electrodes 140, the first isolation structure 150, and the second isolation structure 160. The pixel circuits 120 are located on the substrate 110, and the insulating layer 130 is located on the pixel circuits 120. The first electrodes 140 are located on the insulating layer 130 and are respectively electrically connected to the pixel circuits 120 through the through holes TH in the insulating layer 130. The first isolation structure 150 is located on the insulating layer 130 and overlaps the through holes TH. The second isolation structure 160 includes the separating parts 161 and the cover parts 162. The cover parts 162 respectively overlap the through holes TH and the first isolation structure 150. The first electrode 140 may include the part P2 and the part P3. The part P3 overlaps the through hole TH, and the part P2 at least partially does not overlap the first isolation structure 150 and the second isolation structure 160.

Compared with the display panel 50 in FIG. 5A to FIG. 5B, the structure in the display panel 60 shown in FIG. 6A to FIG. 6B is different in that: the first isolation structure 150 is a mesh structure, and the first isolation structure 150 includes the first subpart 151 and the second subpart 152. The intersection of the first subpart 151 and the second subpart 152 overlaps the through hole TH and the cover part 162, and the second subpart 152 overlaps the separating part 161.

The extending direction of the first subpart 151 may intersect the extending direction of the second subpart 152, and the intersection of the first subpart 151 and the second subpart 152 may belong to the first subpart 151 and may also belong to the second subpart 152. For example, in this embodiment, the extending direction of the first subpart 151 may be substantially perpendicular to the extending direction of the second subpart 152.

In this embodiment, the separating part 161 may completely overlap the second subpart 152 of the first isolation structure 150, which means the orthographic projection of the separating part 161 on the substrate 110 may completely fall into the orthographic projection of the second subpart 152 on the substrate 110, but the disclosure is not limited thereto. In some embodiments, the separating part 161 may partially overlap the second subpart 152 of the first isolation structure 150.

In this embodiment, the cover part 162 is located between the separating part 161 and the second subpart 152, but the disclosure is not limited thereto. In this embodiment, the material of the cover part 162 and the material of the first isolation structure 150 may be the same, and the material of the cover part 162 and the material of the separating part 161 may be different, but the disclosure is not limited thereto. In some embodiments, the material of the cover part 162 and the material of the separating part 161 may be the same, and the material of the cover part 162 and the material of the first isolation structure 150 may be different. In this embodiment, the height of the cover part 162 may be between 0.5 μm and 1 μm, but the disclosure is not limited thereto. With the cover part 162 of the second isolation structure 160 disposed to cover the recess CA in the first subpart 151 of the first isolation structure 150, accumulation of the liquid organic light emitting material in the recess CA may be avoided to ensure the sufficient film thickness formed by the liquid organic light emitting material, thereby improving reliability of the display panel 60.

Figure 7:
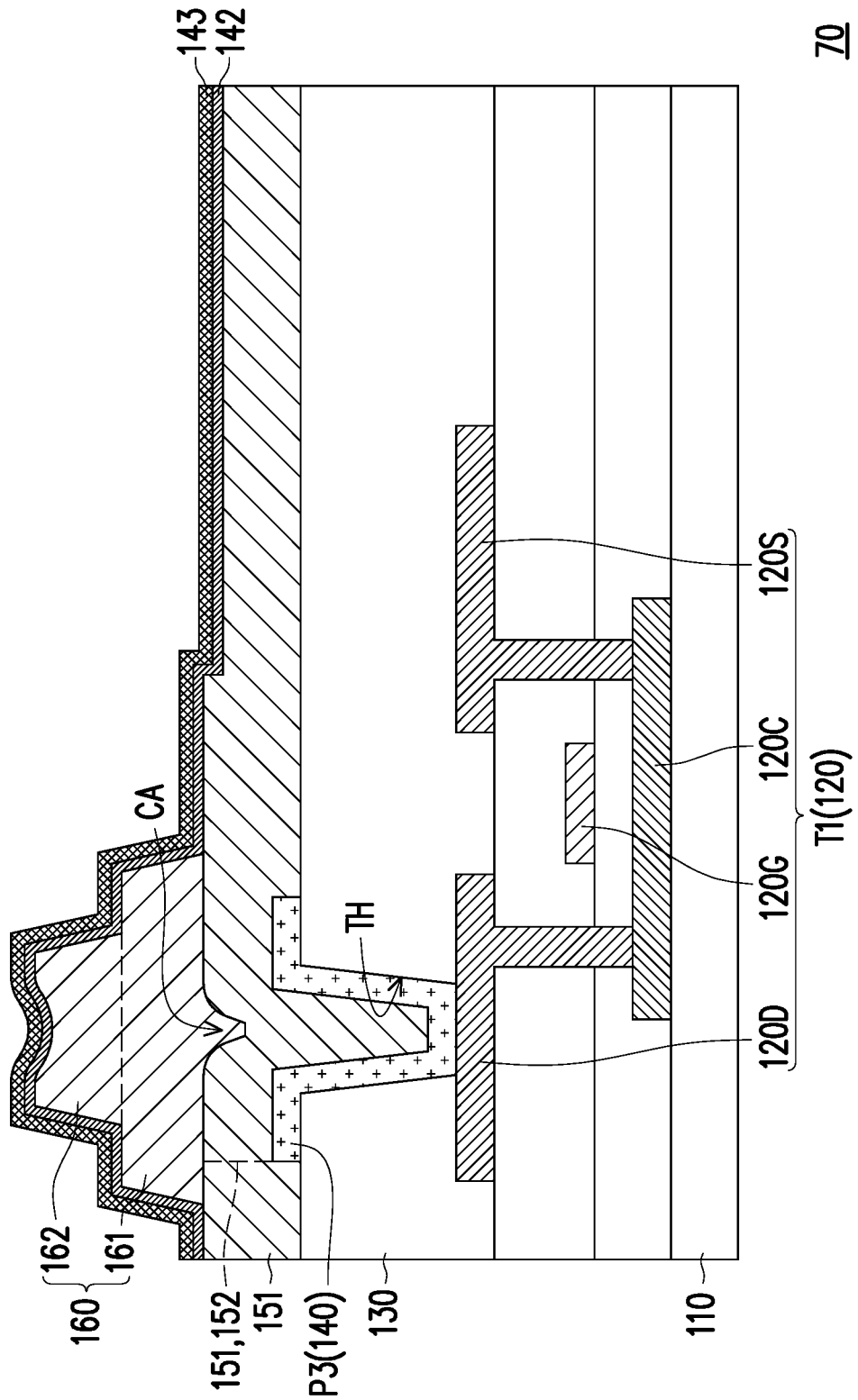
FIG. 7 is a partial schematic cross-sectional view of a display panel 70 according to an embodiment of the disclosure.

FIG. 7 is a partial schematic cross-sectional view of a display panel 70 according to an embodiment of the disclosure. Compared with the display panel 60 of FIG. 6A to FIG. 6B, the structure of the display panel 70 shown in FIG. 7 is different in that: the separating part 161 is located between the cover part 162 and the second subpart 152, and the material of the separating part 161 and the material of the cover part 162 are the same. Therefore, the separating part 161 and the cover part 162 may be formed by an exposure and development process and the subsequent curing procedure through a phase shift mask, a half tone mask, or a gray tone mask. With the cover part 162 of the second isolation structure 160 disposed to cover the recess CA in the first subpart 151 of the first isolation structure 150, accumulation of the liquid organic light emitting material in the recess CA may be avoided to ensure the sufficient film thickness formed by the liquid organic light emitting material, thereby improving reliability of the display panel 70.

In summary, in the disclosure, the cover part of the second isolation structure is disposed to cover the recess in the first isolation structure. In this way, accumulation of the liquid organic light emitting material in the recess may be avoided, and the film thickness formed by the liquid organic light emitting material may be ensured to be sufficient, thereby improving reliability of the display panel.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A display panel, comprising:
   a substrate;
   a plurality of pixel circuits, located on the substrate;
   an insulating layer, located on the plurality of pixel circuits and having a plurality of through holes;
   a plurality of first electrodes, located on the insulating layer and respectively electrically connected to the plurality of pixel circuits through the plurality of through holes;
   a first isolation structure, located on the insulating layer and overlapping the plurality of through holes; and
   a second isolation structure, comprising a plurality of separating parts and a plurality of cover parts, wherein the plurality of separating parts and the first isolation structure at least partially overlap, and the plurality of cover parts respectively overlap the plurality of through holes and the first isolation structure,
   wherein the plurality of first electrodes are disposed outside a region between adjacent separating part and cover part in a cross-sectional view cut through the adjacent separating part and cover part along an extending direction of the first isolation structure.

2. The display panel according to claim 1, wherein the plurality of cover parts and the plurality of separating parts are alternatively arranged along the extending direction of the first isolation structure in a top view.

3. The display panel according to claim 1, wherein one of the plurality of separating parts is overlapped with and located between corresponding one of the plurality of cover parts and corresponding one of the plurality of first electrodes.

4. A display panel, comprising:
   a substrate;
   a plurality of pixel circuits, located on the substrate;
   an insulating layer, located on the plurality of pixel circuits and having a plurality of through holes;
   a plurality of first electrodes, located on the insulating layer and respectively electrically connected to the plurality of pixel circuits through the plurality of through holes;
   a first isolation structure, located on the insulating layer and overlapping the plurality of through holes; and
   a second isolation structure, comprising a plurality of separating parts and a plurality of cover parts, wherein the plurality of separating parts and the first isolation structure at least partially overlap, and the plurality of cover parts respectively overlap the plurality of through holes and the first isolation structure,
   wherein each of the plurality of first electrodes has a first part overlapping corresponding one of the plurality of through holes, the first part has two edge portions disposed on the insulating layer, and an orthographic projection of corresponding one of the plurality of cover parts on the substrate covers an orthographic projection of the two edge portions of the first part on the substrate.

5. The display panel according to claim 4, wherein the first parts of the plurality of first electrodes are overlapped with the plurality of cover parts respectively.

6. The display panel according to claim 4, wherein each of the plurality of first electrodes further has a second part connected to the first part, and the second part is surround by the first isolation structure and the second isolation structure.

* * * * *